United States Patent
Mandeville et al.

(10) Patent No.: US 10,475,302 B2
(45) Date of Patent: *Nov. 12, 2019

(54) SYSTEMS, DEVICES AND METHODS FOR WIRELESSLY DELIVERING HAPTIC EFFECTS

(71) Applicant: IMMERSION CORPORATION, San Jose, CA (US)

(72) Inventors: Alexia Mandeville, San Jose, CA (US); Juan Manuel Cruz-Hernandez, Montreal (CA); Vahid Khoshkava, Montreal (CA)

(73) Assignee: IMMERSION CORPORATION, San Jose, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/172,352

(22) Filed: Oct. 26, 2018

(65) Prior Publication Data

US 2019/0180575 A1 Jun. 13, 2019

Related U.S. Application Data

(63) Continuation of application No. 15/834,586, filed on Dec. 7, 2017, now Pat. No. 10,115,274.

(51) Int. Cl.
*G08B 6/00* (2006.01)
*H01Q 7/00* (2006.01)
(Continued)

(52) U.S. Cl.
CPC ............ *G08B 6/00* (2013.01); *G06F 3/014* (2013.01); *G06F 3/016* (2013.01); *H01Q 1/225* (2013.01); *H01Q 1/2216* (2013.01); *H01Q 1/38* (2013.01); *H01Q 7/00* (2013.01); *H01L 41/0926* (2013.01); *H01L 41/193* (2013.01); *H01L 41/29* (2013.01); *H01L 41/317* (2013.01); *H01Q 9/0407* (2013.01)

(58) Field of Classification Search
CPC ..... G08B 6/00; H01L 41/0926; H01L 41/193; H01L 41/29; H01L 41/317; H01Q 7/00
USPC .......................................... 340/407.1, 407.2
See application file for complete search history.

(56) References Cited

U.S. PATENT DOCUMENTS 9,898,903 B2 * 2/2018 Khoshkava .............. G08B 6/00
2006/0016896 A1 * 1/2006 Grupp .................... G04G 21/06
235/492

(Continued)

OTHER PUBLICATIONS

The Extended European Search Report issued in European Application No. 18210056.0, dated Apr. 4, 2019.

(Continued)

*Primary Examiner* — Ojiako K Nwugo
(74) *Attorney, Agent, or Firm* — Medler Ferro Woodhouse & Mills PLLC

(57) ABSTRACT

Systems, devices, and methods for wirelessly delivering haptic effects are provided. The devices may include haptic actuators secured to various substrates, including the body and clothing of a user. The haptic actuators may be secured via adhesive and/or may be applied as a curable liquid. The haptic actuators may include an actuator element and a power element. The power element may include an antenna for receiving wireless power and control signals that may be transferred to the haptic actuator to cause a haptic effect.

20 Claims, 9 Drawing Sheets

(51) Int. Cl.

| | | |
|---|---|---|
| | *H01Q 1/22* | (2006.01) |
| | *H01Q 1/38* | (2006.01) |
| | *G06F 3/01* | (2006.01) |
| | H01Q 9/04 | (2006.01) |
| | H01L 41/193 | (2006.01) |
| | H01L 41/29 | (2013.01) |
| | H01L 41/317 | (2013.01) |
| | H01L 41/09 | (2006.01) |

(56) References Cited

U.S. PATENT DOCUMENTS

| | | | |
|---|---|---|---|
| 2009/0045820 A1* | 2/2009 | Shimazawa | H01F 17/0006 |
| | | | 324/652 |
| 2009/0096746 A1 | 4/2009 | Kruse et al. | |
| 2010/0211186 A1 | 8/2010 | Senders et al. | |
| 2017/0067757 A1* | 3/2017 | Choi | G01D 5/2405 |
| 2017/0193760 A1* | 7/2017 | Levesque | G06Q 20/352 |
| 2017/0201296 A1* | 7/2017 | Pittman | H04B 5/0037 |

OTHER PUBLICATIONS

Ando et al., "A Fingernail-Mounted Tactile Display for Augmented Reality Systems," Electronics and Communications in Japan, Part 2 (2007) 90(4):56-65.

* cited by examiner

SYSTEMS, DEVICES AND METHODS FOR WIRELESSLY DELIVERING HAPTIC EFFECTS

CROSS-REFERENCE TO RELATED APPLICATIONS

This application is a continuation application U.S. patent application Ser. No. 15/834,586, filed Dec. 7, 2017, which issued as U.S. Pat. No. 10,115,274 on Oct. 30, 2018. The contents of each of the foregoing application are hereby incorporated by reference.

FIELD OF THE INVENTION

The present invention is directed to systems, devices, and methods for wirelessly delivering haptic effects.

BACKGROUND OF THE INVENTION

Video games, virtual reality (VR), and augmented reality (AR) systems have become ever more popular. In a typical implementation, a computer system displays a visual or graphical environment to a user on a display device, which may include a display screen and/or a headset. Users can interact with the displayed environment by inputting commands or data from a controller or peripheral device. The computer updates the environment in response to the user's manipulation of a manipulandum such as a joystick handle and provides visual feedback to the user using the display screen.

Conventional video game devices or controllers use visual and auditory cues to provide feedback to a user. In some controller or peripheral devices, kinesthetic feedback (such as active and resistive haptic feedback) and/or tactile feedback (such as vibration, texture, and heat) is also provided to the user, more generally known collectively as "haptic feedback" or "haptic effects." Haptic feedback can provide cues that enhance and simplify the user controller or peripheral device. For example, vibration effects, or vibrotactile haptic effects, may be useful in providing cues to users of electronic devices to alert the user to specific events, or provide realistic feedback to create greater sensory immersion within a simulated or virtual environment. Conventional haptic feedback systems for gaming and other devices generally include an actuator for generating the haptic feedback attached to the housing of the controller/peripheral. More particularly, motors or other actuators of the controller or peripheral device are housed within the controller and are connected to the controlling computer system. The computer system receives sensor signals from the controller or peripheral device and sends appropriate haptic feedback control signals to the actuators. The actuators then provide haptic feedback to the controller. The computer system can thus convey physical sensations to the user in conjunction with other visual and auditory feedback.

Conventional haptic devices are located within computing devices and/or within dedicated peripheral devices, requiring a user to grasp or hold the device. In contrast, systems, devices, and methods presented herein provide a solution allowing a user to secure wirelessly activated haptic enabled devices directly to body parts, clothing, and other surfaces such that haptic feedback/effects may be felt by a user without grasping or holding a haptically-enabled computing or peripheral device.

BRIEF SUMMARY OF THE INVENTION

In an embodiment, a device for providing a haptic effect includes an actuator element including an electrode layer, a smart material layer, and a grounding electrode layer, and a power element including an antenna configured to receive a haptic control signal, a first contact, and a second contact, wherein the antenna is in electrical communication with the first contact and the second contact. The electrode layer is configured for location between the smart material layer and the power element, the first contact is configured for electrical communication with the electrode layer, the second contact is configured for electrical communication with the grounding electrode layer, the antenna is configured to induce a voltage differential between the electrode layer and the grounding electrode layer in response to the haptic control signal, and the smart material layer is configured for actuation in response to the voltage differential for providing the haptic effect.

In another embodiment, a system for wirelessly providing a haptic effect includes at least one haptic enabled device and a transmission unit configured to transmit a haptic control signal to an antenna of the haptic enabled device. The at least one haptic enabled device includes an actuator element having an electrode layer, a smart material layer, and a grounding electrode layer, and a power element including the antenna configured to receive a haptic control signal, a first contact, and a second contact. The antenna is in electrical communication with the first contact and the second contact, the electrode layer is configured for location between the smart material layer and the power element, the first contact is configured for electrical communication with the electrode layer, the second contact is configured for electrical communication with the grounding electrode layer, the antenna is configured to induce a voltage differential between the electrode layer and the grounding electrode layer in response to the haptic control signal, and the smart material layer is configured for actuation in response to the voltage differential for providing the haptic effect.

In another embodiment, a method for wirelessly providing a haptic effect includes securing a haptic enabled device to a substrate, wherein the haptic enabled device includes an actuator element having an electrode layer and a smart material layer, and a power element including an antenna configured to receive a haptic control signal, a first contact, and a second contact. The antenna is in electrical communication the first contact and the second contact. The method further includes receiving, via the antenna, the haptic control signal, transferring the haptic control signal to the electrode layer and a grounding electrode layer via the first contact and the second contact to cause a voltage differential between the electrode layer and the grounding electrode layer, and actuating the smart material layer by the voltage differential to provide the haptic effect.

The above described embodiments are for illustrative purposes only, and additional embodiments within the scope of this disclosure are described herein.

BRIEF DESCRIPTION OF DRAWINGS

The foregoing and other features and advantages of the invention will be apparent from the following description of embodiments hereof as illustrated in the accompanying drawings. The accompanying drawings, which are incorporated herein and form a part of the specification, further serve to explain the principles of the invention and to enable a person skilled in the pertinent art to make and use the invention. The drawings are not to scale.

DETAILED DESCRIPTION OF THE INVENTION

Figure 1:
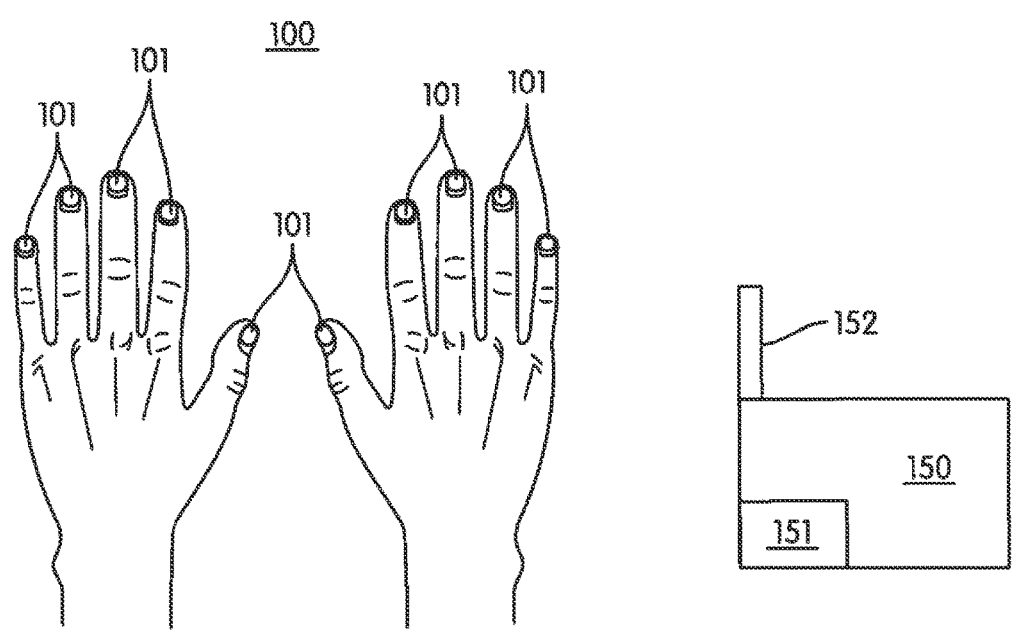
FIG. 1 illustrates an embodiment of a wireless haptic system in accordance with an embodiment hereof.

Specific embodiments of the present invention are now described with reference to the figures, wherein like reference numbers indicate identical or functionally similar elements. The following detailed description is merely exemplary in nature and is not intended to limit the invention or the application and uses of the invention. Furthermore, there is no intention to be bound by any expressed or implied theory presented in the preceding technical field, background, brief summary or the following detailed description. Furthermore, although the following description is directed to the use of wireless haptic actuators for use in gaming, augmented reality, virtual reality, and with mobile devices, those skilled in the art would recognize that the description applies equally to other systems.

Embodiments of the present invention are directed to wireless haptic enabled devices that may be secured to surfaces, clothing, and/or body parts to provide haptic actuation to an article or object that does not ordinarily support haptic output. In an example embodiment, a wireless haptic enabled device is secured to one or more digits, i.e., fingernail or toenail, of a user. The wireless haptic enabled device includes a power element and an actuator element. The power element includes an antenna for receiving a wireless signal and electrical contacts connected to the actuator element. The antenna receives a wireless signal and uses the energy of the received signal to power the actuator element, causing a haptic sensation in the digit(s), i.e., fingertip(s) or toe(s), of the user. When a plurality of wireless haptic enabled devices are secured to a plurality of digits of a user, actuator elements on the user's different digits may be selectively actuated, permitting the system to provide selective haptic effects to the user's different digits. In a virtual reality or augmented reality setting, the system may be used to provide an indication of virtual contact with a virtual object, providing the user with a more immersive experience. Thus, in a virtual or augmented reality setting, when a user reaches out and touches or grasps an object, those digits in contact with the object may receive a haptic sensation. The haptic sensation may be modified, for example, based on parameters of the contact. For example, as a user grasps the virtual object more tightly, the haptic sensations may be increased.

Further embodiments are discussed and described herein. In an embodiment, a wireless haptic actuator may be secured to a user's clothing to provide a garment capable of providing haptic effects. In another embodiment, a wireless haptic actuator may be secured to an accessory of the user (e.g., a watch, eyeglasses, jewelry, etc.) to provide a discreet haptic notification device. In yet another embodiment, a wireless haptic actuator may be secured to a computing accessory, such as a mouse, that does not natively support haptic actuation. These and further embodiments are described herein.

FIG. 1 illustrates an embodiment of a wireless haptic system 100 in accordance with an embodiment hereof. FIG. 1 illustrates a plurality of wireless haptic enabled devices 101 and an activation unit 150. As illustrated in FIG. 1, the haptic enabled devices 101 may be secured to various objects. The wireless haptic enabled devices may be secured, for example, to body parts of a user, including the fingers, head, feet, and other areas. The wireless haptic enabled devices may also be secured to clothing of a wearer. In some implementations, the wireless haptic enabled devices 101 may be secured to other objects, including desks, chairs, gaming controllers, etc.

The activation unit 150 may include at least a control unit 151 and an antenna 152. The antenna 152 may be configured to wirelessly transmit haptic control signals. The activation unit 150 may be a dedicated unit configured for transmitting haptic control signals in the wireless haptic system 100. The control unit 151 selects haptic control signals for transmission and causes the haptic control signals to be transmitted via the antenna 152. In some implementations, the activation unit 150 may be part of another system, e.g., a computer system. In such implementations, the control unit 151 may be a component of the computer system and/or may be a unit dedicated to selecting and transmitting haptic control signals. In some implementations, the activation unit 150 may be a personal device, such as a tablet or smart phone, and may be configured to transmit haptic control signals via the antenna 152.

Computer systems consistent with the present invention that may fulfill the role of the activation unit 150 and/or the control unit 151 may be configured as servers (e.g., having one or more server blades, processors, etc.), gaming consoles, handheld gaming devices, personal computers (e.g., a desktop computer, a laptop computer, etc.), smartphones, tablet computing devices, and/or other devices that can be programmed to provide a haptic control signal. In some implementations, computer systems consistent with the present invention may include cloud based computer platforms. Such computer systems may include one or more processors (also interchangeably referred to herein as processors, processor(s), or a processor for convenience), one or more storage devices, and/or other components. The computer system processors may be programmed by one or more computer program instructions to carry out methods described herein. As used herein, for convenience, the various instructions may be described as performing an operation, when, in fact, the various instructions program the processors (and therefore the computer system) to perform the operation.

In some implementations, computer systems consistent with the invention may be used to communicate with the activation unit 150, providing haptic output commands to the activation unit 150 to cause the activation unit 150 to transmit wireless haptic control signals to the wireless haptic enabled devices. Thus, the activation unit 150 may be a peripheral device connectable to the computer system via a haptic communication unit of the computer system. Haptic communication units consistent with the present invention may include any connection device, wired or wireless, that may transmit or communicate a haptic output command. For example, a haptic communication unit may include a wireless device, such as a Bluetooth antenna, configured to communicate with the activation unit 150, to deliver a haptic output command for causing the activation unit 150 to transmit a haptic control signal. The haptic communication unit may further include a wired (e.g., micro/mini/standard USB, HDMI, etc.) port for communicating a haptic output command. In some implementations, a haptic communication unit may be a dedicated unit configured solely for delivering a haptic output command. In some implementations, a haptic communication unit may further function to deliver a myriad of other communications, wired or wirelessly, to an external device.

The computer system may further include audio outputs and a visual display. The computer system may be coupled to a visual display via wired or wireless means. The visual display may include any type of medium that provides graphical information to a user; including, but not limited to, VR/AR headsets, monitors, television screens, plasmas, liquid crystal displays (LCDs), projectors, or any other display devices. In another embodiment, the computer system and visual display may be combined into a single device.

The antenna 152 of activation unit 150 transmits one or more haptic control signals. In some implementations, the one or more haptic control signals transmitted by the antenna comprise one or more modulated power signals. The one or more modulated power signals, when received by the wireless haptic enabled devices 101, supply power to and cause the activation of the wireless haptic enabled devices 101. In such an implementation, control of the activation is provided through modulation of the power signal. For example, a pulsed power signal will result in pulsed activations of a respective wireless haptic enabled device. In other examples, the amplitude of the power signal may be modulated according to square inputs, ramped inputs, triangular inputs, sine wave inputs, and others. Modulation of the power signal may be performed at varying frequencies, from low frequencies of 1-50 Hz to higher frequencies of 50-500 Hz, and more. In embodiments hereof, the power signal may be dynamically adjusted to provide specific haptic effects. For example, when a user interacts with an elastic virtual item, the power signal may increase in amplitude as the user closes their hand, simulating greater force from the elastic virtual item as it is squeezed.

In some implementations, haptic control signals transmitted by the antenna 152 may include separate power and command signals. A power signal may be received by the wireless haptic enabled device 101 to supply power to the device 101. The received power signal may be used to store energy, for example in a capacitor and/or a battery of the device 101. A separate command signal may also be received by the haptic enabled device to provide instructions for actuation. Thus, in response to a received command signal, the wireless haptic enabled device 101 may use power from the received power signal to cause an activation of the wireless haptic enabled device 101.

The activation unit 150 provides haptic control signals to activate the wireless haptic enabled devices 101. In the embodiment illustrated in FIG. 1, a user may have wireless haptic enabled devices 101 secured to each digit or finger of a hand or hands. Activation of the wireless haptic enabled devices causes a haptic effect to be felt in the digit(s) of the user. In some embodiments, a haptic control signal may actuate all of the wireless haptic enabled devices 101 together. In some embodiments, the haptic control signal may actuate each wireless haptic enable device 101 individually. In some embodiments, the haptic control signal may selectively actuate one or more of the haptic enabled devices 101. For example, in a virtual reality setting where a user grasps an object between the index finger and the thumb, the wireless haptic enabled devices 101 secured to the index finger and thumb may be actuated, while the wireless haptic enabled devices 101 secured to the middle finger, ring finger, and little finger may be dormant.

The haptic enabled devices 101 and activation unit 150 may be employed in various contexts. For example, in a VR or AR context, the haptic enabled devices 101 may be selectively activated to indicate virtual contact between the user's fingers and virtual objects. Each of the devices 101 that is attached to a finger that makes virtual contact with the virtual object may be actuated. In a conventional video gaming context, the haptic enabled devices 101 may be selectively actuated to provide the user with additional sensations, leading to a more immersive experience. In other embodiments, the wireless haptic enabled devices 101 may be secured to a user's watch, eyeglasses, jewelry, or other accessory. The user's mobile device may serve as the activation unit 150, and transmit a haptic control signal to the wireless haptic enabled device to discreetly provide notifications of e-mails, text messages, and other events.

Figure 2A:
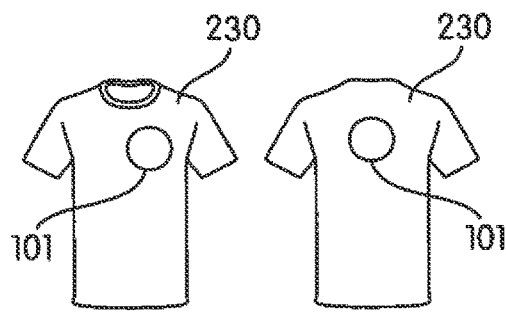
FIGS. 2A-2D illustrate several exemplary substrates for attachment of a wireless haptic enabled device in accordance with embodiments hereof.
Figure 2B:
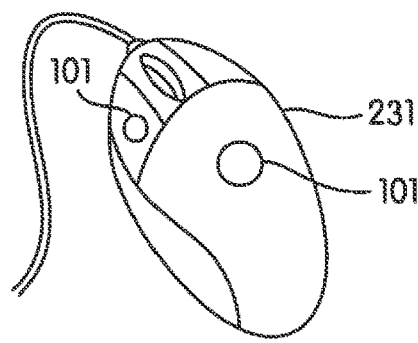
Figure 2C:
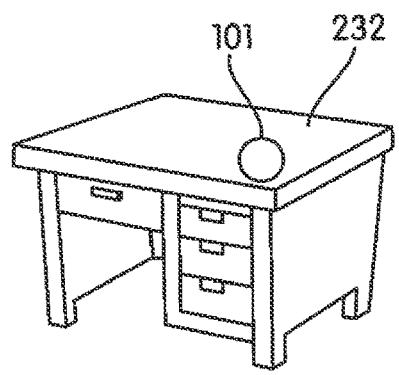
Figure 2D:
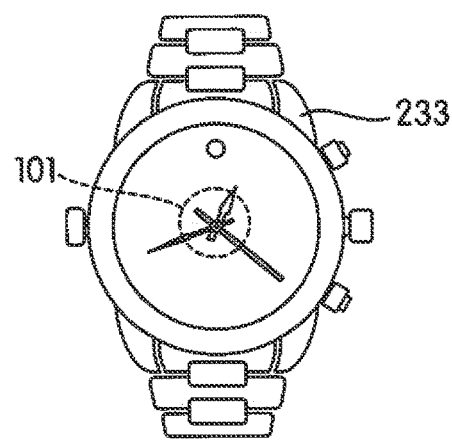

In some implementations, the haptic enabled devices 101 may be secured to substrates different than a user's fingers or hands. For example, the haptic enabled devices 101 may be secured to a desktop surface, clothing, an input device, a clothing/jewelry accessory, and any other suitable surface. FIGS. 2A-2D illustrate several exemplary substrates for attachment of a wireless haptic enabled device 101. FIG. 2A illustrates the wireless haptic enabled devices 101 secured to a wearer's clothing 230. The wireless haptic enabled devices 101 may be secured, for example, via cloth tape, iron-on tapes, sewn on patches, and other adhesives. Securing multiple wireless haptic enabled devices 101 to clothing may serve to turn any clothing article, e.g., gloves, headbands, wristbands, shirts, pants, under-shirts, shoes, socks, etc., into a wearable haptic device. FIG. 2B illustrates the wireless haptic enabled devices 101 secured to an input device 231. Input devices may include, e.g., computer mice, keyboards, joysticks, gamepads, and any other device used to provide input to a computer system. Secured to this type of substrate, the wireless haptic enabled devices 101 may haptically enable a device that does not ordinarily or easily include haptic functionality. For example, wireless haptic enabled devices 101 may be secured to a computer mouse or keyboard to provide haptic functionality to these devices. FIG. 2C illustrates the wireless haptic enabled devices 101 secured to a desktop surface 232, which may provide a user with a haptic surface. FIG. 2D illustrates a watch 233 with a secured wireless haptic enabled device 101. Secured to a clothing accessory or piece of jewelry, such as a watch, earring, ring, bracelet, necklace, eyeglasses, etc., the wireless haptic enabled devices 101 may provide haptic functionality to an ordinary object.

Figure 3A:
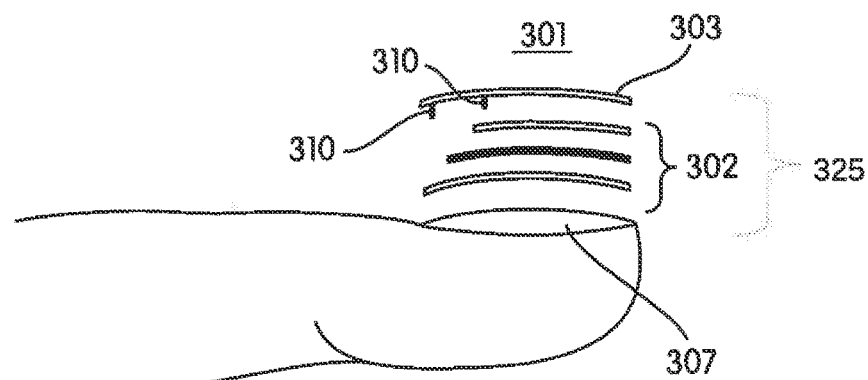
FIGS. 3A-3C illustrate a wireless haptic enabled device in accordance with an embodiment hereof.
Figure 3B:
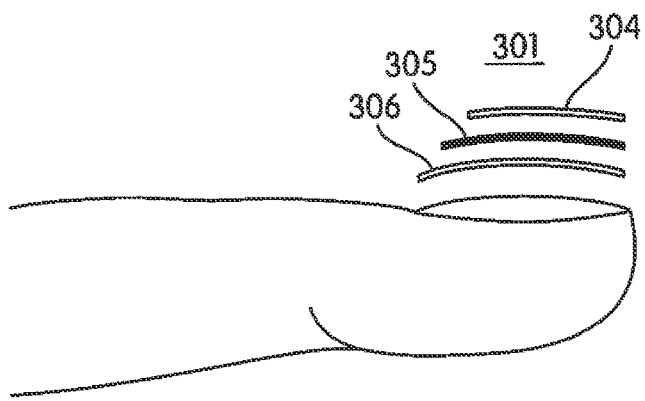
Figure 3C:
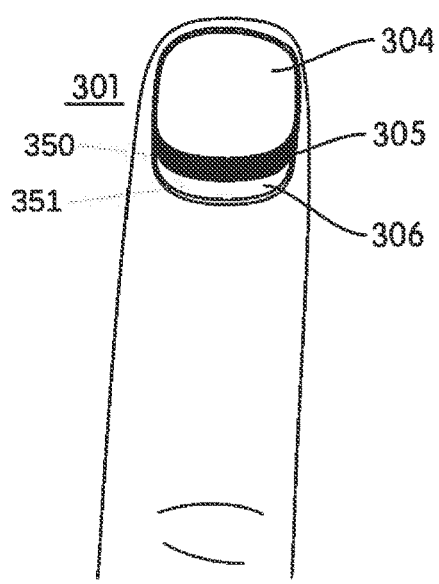

FIGS. 3A-3C illustrate the features of a wireless haptic enabled device 301, according to an embodiment hereof. The wireless haptic enabled device 301 may include an actuator element 302, which may include an electrode layer 304, a smart material layer 305, and a grounding electrode layer 306. The wireless haptic enabled device 301 may further include a power element 303, illustrated in greater detail in FIG. 4.

In the embodiment of FIGS. 3A-3C, the actuator element 302 includes the electrode layer 304, the smart material layer 305, and the grounding electrode layer 306. In an embodiment, the electrode layer 304 may include any securable conductive material, including graphene, conductive ink, copper tape, and others. In an embodiment, the smart material layer 305 may comprise, for example, an electroactive polymer material, including piezoceramic materials, piezo polymer materials including PVDF (PolyVinylidene Floride) or its copolymer PVDF with trifluoroethylene (TrFE) and/or tetrafluoroethylene (TFE), electroactive polymer materials including terpolymers PVDF-TrFE-TFE or poly(vinylidene fluoride-trifluoroethylene-chlorotrifluoroethylene), and/or dielectric elastomer materials. The smart material layer 305 may be configured for actuation, such as contraction, bending, flexing, etc., when subject to a voltage differential.

Figure 4:
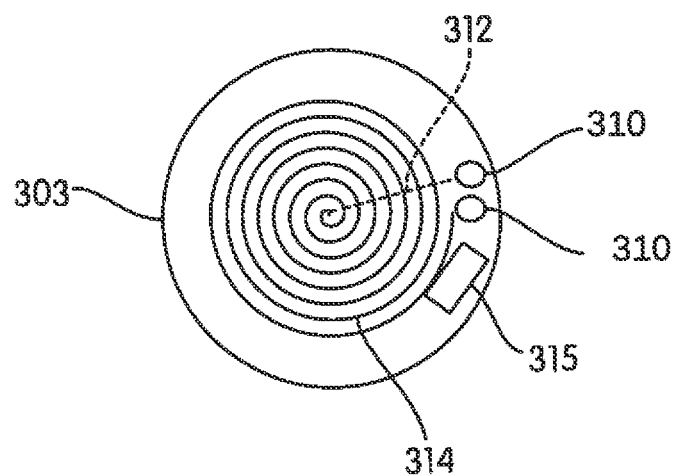
FIG. 4 illustrates a power element of a wireless haptic enabled device in accordance with an embodiment hereof.

FIG. 4 illustrates the power element 303. The power element 303 includes an antenna 314 and at least two contacts 310. The power element 303 may further include power element matching circuitry 315 and a circuit bridge 312. The antenna 314 may be a substantially flat or disc-shaped antenna, having a height that is significantly smaller than a width or length. In the embodiment of FIG. 4, by way of example and not limitation, the antenna 314 is shown as a coil or spiral antenna, having a plurality of windings. FIG. 4 illustrates a one-way spiral antenna, having end points at the center and at the outer circumference. Other spiral or coil antennas may be used, including those having multiple arms, those having two circumference end points, those having two central end points, and others. Other flat antennas may also be used, including, for example, plate antennas. The antenna 314 may be configured to receive radiofrequency signals, including, e.g., a haptic control signal as transmitted by the activation unit 150. The antenna 314 may be configured with a specific resonant frequency. The resonant frequency of the antenna 314 is dependent on the size, shape, and materials of the antenna 314. When configured as a coil or spiral, the resonant frequency of the antenna 314 is dependent on the number, size, and shape of the spiral coils, as well as the size and properties of the material that forms the antenna 314. Antenna 314 may be formed, for example, from aluminum, copper, gold, and/or any other conductive material.

The circuit bridge 312 may be an insulated wire configured to cross from the center of the coil of the antenna 314, an innermost end, to the perimeter of the coil of the antenna 314, an outermost end, to allow the termination points of the antenna 314 to reach the contacts 310. The circuit bridge 312 may be configured in any shape or form necessary to permit the antenna 314 to electrically communicate with the contacts 310. In some implementations, multiple circuit bridges 312 may be required to bridge the termination points of the antenna 314 to the contacts 310.

The power element matching circuitry 315 may be configured as impedance matching circuitry to provide an impedance match between the power element circuit, i.e., the antenna 314, circuit bridge 312, contacts 310, and power element matching circuitry 315, and the load, i.e., the actuator element 302. Impedance matching prevents impedance mismatch, which may lead to power reflection and, thus, inefficient power transfer. The power element matching circuitry 315 may include any combination of circuit elements, e.g., resistors, capacitors, inductors, etc., to match impedances between the power element circuit and the actuator element.

The contacts 310 may extend from the power element 303. As discussed above, the contacts 310 may be in electrical communication with the antenna 314. The contacts 310 may further be configured to make contact with the grounding electrode layer 306 and the electrode layer 304 of the actuator element 302. Thus, the contacts 310 are configured to establish an electrical connection between the antenna 314 and the electrode layer 304 and grounding electrode layer 306 when the power element 303 is secured to overlay the actuator element 302.

As illustrated in FIGS. 3A-3C, the smart material layer 305 may overlay the grounding electrode layer 306, leaving at least a portion of the grounding electrode layer 306 exposed, creating the grounding electrode layer exposed portion 351. The electrode layer 304 may overlay the smart material layer 305, leaving at least a portion of the smart material layer 305 exposed, creating the smart material layer exposed portion 350. The contacts 310 of the power element 303 are configured to contact the electrode layer 304 and the grounding electrode layer 306, to establish electrical communication between these layers and the power element.

Accordingly, when the wireless haptic enabled device 301 is assembled, the actuator element 302 may be secured to a substrate 307. As illustrated in FIG. 3A, the substrate 307 may be a user's finger nail. As shown, e.g., in FIGS. 2A-D, the substrate may also include various other surfaces and/or objects. The power element 303 may be secured to overlay the actuator element 302, such that the electrode layer 304 is located between the smart material layer 305 and such that the contacts 310 of the power element 303 establish electrical communication between the antenna 314 and the electrode layers 304, 306 of the actuator element 302.

When the antenna 314 receives a wireless transmission, e.g., a haptic control signal, the received transmission induces a current in antenna 314. The induced current causes a voltage differential between the electrode layer 304 and the grounding electrode layer 306, which in turn causes actuation of the smart material layer 305. The antenna 314 may receive the haptic control signal as a radiofrequency transmission having a transmission frequency. As discussed above, the smart material layer may be configured for actuation in response to the voltage differential. The voltage differential between the electrode layer 304 and the grounding electrode layer 306 may oscillate at the transmission frequency, causing the smart material layer to vibrate at the transmission frequency. The vibrations of the smart material layer 305 may, in turn, cause the substrate 307 to vibrate, allowing the user to experience a haptic response.

In some implementations, the antenna 314 may be configured with a resonant frequency substantially similar, e.g., within 10% of, the transmission frequency. Such matched frequencies result in a higher efficiency transmission. In some implementations, the transmission frequency of the haptic control signal and/or the resonant frequency of the antenna 314 may be selected to be substantially similar to a mechanical resonant frequency of the haptic device structure 325 that includes the wireless haptic enabled device 301 (the power element 303 and the actuator element 302) and the substrate 307 to which it is secured. By matching the transmission frequency of the haptic control signal to the resonant frequency of the haptic device structure 325, the vibrations of the haptic device structure 325 induced by the smart material layer 305 may be amplified. Accordingly, although the haptic control signal may be transmitted with relatively low power, the substantially similar matching between the transmission frequency, resonant frequency of the antenna 314, and mechanical resonant frequency of the haptic device structure 325 may amplify the haptic effect such that a user will feel a strong sensation relative to the power level of the transmitted haptic control signal.

In some implementations, the power element circuitry 315 may further include one or more energy storage elements and/or logic elements. Energy storage elements may include, for example, capacitors and/or batteries. In such implementations, the haptic control signal may include a power signal and a command signal. Energy transmitted via the power signal of the haptic control signal may be received by antenna 314 and stored in the energy storage elements for later use. The stored energy may be released in response to the command signal, as received by the logic elements of the power element 303.

Wireless haptic enabled devices 301 may be secured to substrates 307 in various ways. In accordance with embodiments hereof, aspects of the wireless haptic enabled devices 301 may be supplied in liquid, paintable form and applied to a substrate a layer at a time. For instance, a conductive liquid, such as inks containing silver, silver-chloride, and/or graphite, may be applied to the substrate 307 to function as the grounding electrode layer 306. When the conductive liquid dries or cures, a conductive layer remains to serve as the grounding electrode layer 306. Thereafter the smart material layer 305 may also be applied as a liquid, for example, a liquid electroactive polymer. The liquid smart material may be applied to the grounding electrode layer 306 so as to serve as the smart material layer 305 after it has cured. In turn, the conductive liquid may then be applied to the smart material layer 305 to serve as the electrode layer 304 after it has cured. Thus, all of the layers of the actuator element 302 may be applied, or painted on, one by one in liquid form. The arrangement of the layers and their exposure to the contacts 310 of the power element 303 may be selectively prepared during the application of the liquid. After curing, the power element 303 may be secured to overlay the actuator element 302 as described above. The power element 303 may be secured, for example, via an adhesive such as glue, sticky tape, or other adhesive substance. Accordingly, the power element 303 may include an adhesive layer.

In some implementations, the actuator element 302 may be secured to the substrate 307 using an adhesive, as discussed above. Thus, the actuator element 302 may include an adhesive layer. In some implementations, the actuator element 302 and the power element 303 may be configured to be secured to the substrate 307 together. That is, the power element 303 and actuator element 302 may be designed such that they are secured to one another during a manufacturing process for subsequent securing to the substrate 307 via an adhesive.

Although several methods of securing the wireless haptic enabled device 301 to the substrate 307 are described in detail herein, alternative methods of securing the wireless haptic enabled device 301 to a substrate 307, such as sewing, heat-sealing, and others remain within the scope of this disclosure.

In some implementations, the electrode layers 304, 306 and smart material layer 305 may be transparent. These layers may be transparent when applied in the form of curable liquids and when secured as prefabricated layers. The power element 303 may also be at least partially transparent.

Figure 5A:
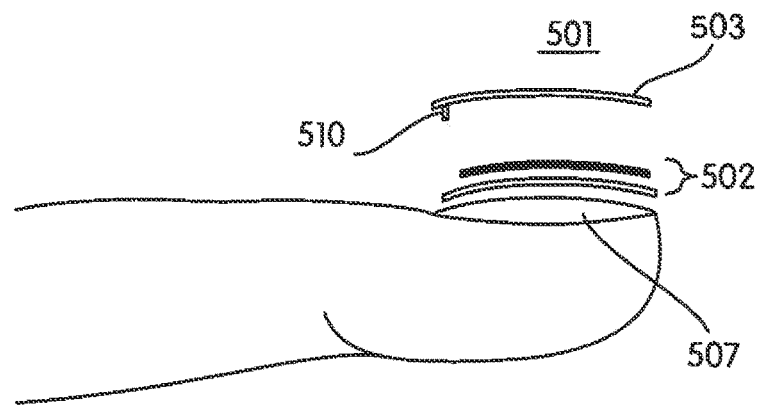
FIGS. 5A-5C illustrate a wireless haptic enabled device using a power layer as an electrode in accordance with an embodiment hereof.
Figure 5B:
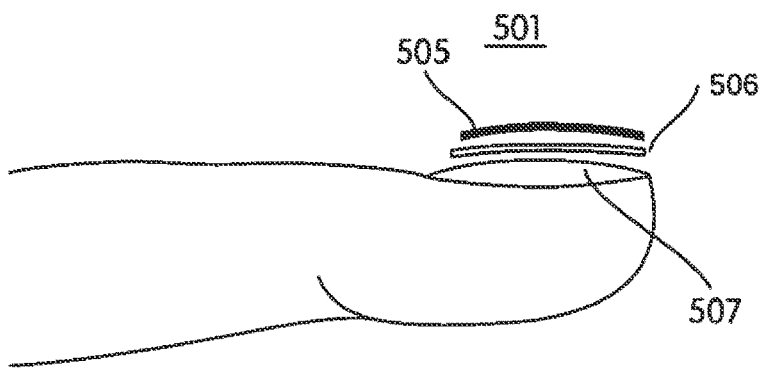
Figure 5C:
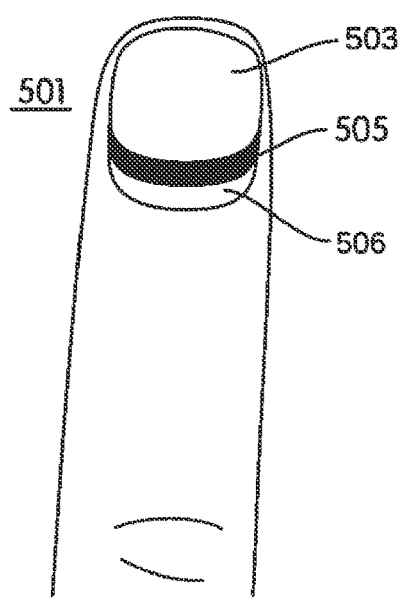

FIGS. 5A-5C illustrate a wireless haptic enabled device 501 in accordance with embodiments hereof. The wireless haptic enabled device 501 may include an actuator element 502, which may include a smart material layer 505 and a grounding electrode layer 506 secured to a substrate 507. Wireless haptic enabled device 501 may further include a power element 503. The components and operation of the wireless haptic enabled device 501 are generally similar to those of the wireless haptic enabled device 301. As shown in FIG. 5A, wireless haptic enabled device 501 does not include a separate electrode layered atop smart material layer 505. Instead, the power layer 503 itself serves as the second electrode. Power layer 503 includes components similar to those discussed above with respect to power layer 303. Power layer 503 includes a contact 510 configured to make contact with the grounding electrode layer 506. When the antenna (not shown) of power layer 503 receives the haptic control signal, a voltage potential difference is established between the power layer 503 and the grounding electrode layer 506. The voltage potential difference activates the smart material layer 505. Arranged thusly, the power layer 503 functions as the top electrode layer.

Figure 6A:
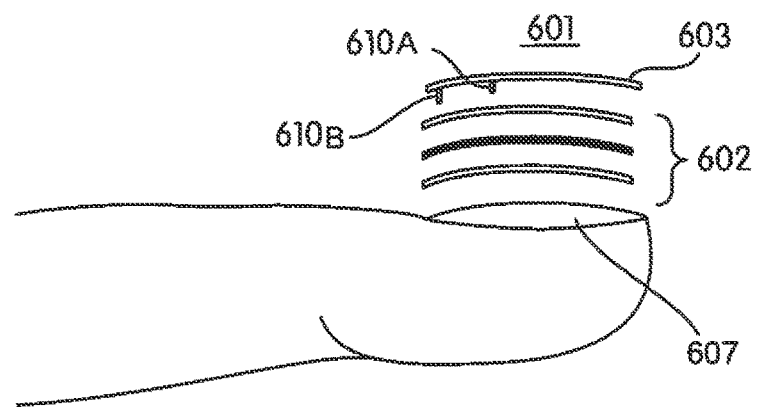
FIG. 6A-6C illustrate a wireless haptic enabled device in accordance with an embodiment hereof.
Figure 6B:
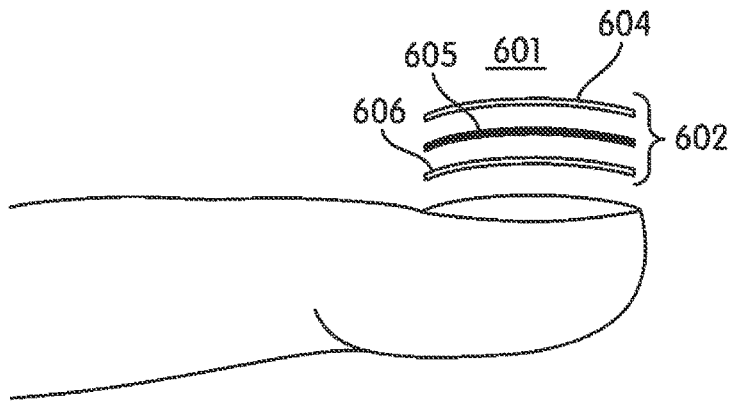
Figure 6C:
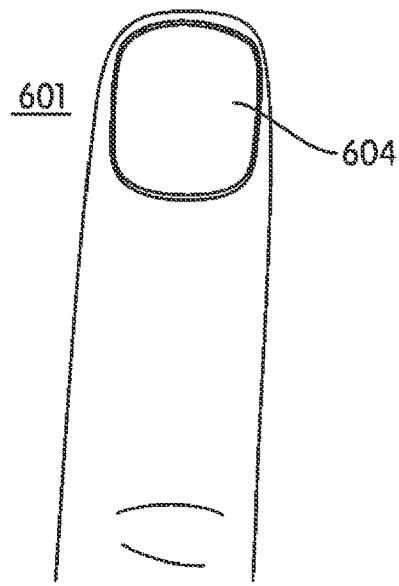

FIGS. 6A-6C illustrate a wireless haptic enabled device 601 consistent with an embodiment in accordance herewith. The wireless haptic enabled device 601 may include an actuator element 602, which may include an electrode layer 604, a smart material layer 605, and a grounding electrode layer 606, all secured to a substrate 607. The wireless haptic enabled device 601 may further include a power element 603. The components and operation of the wireless haptic enabled device 601 are generally similar to those of the wireless haptic enabled device 301. As shown in FIG. 6B, the electrode layer 604 of the wireless haptic enabled device 601 overlays the smart material layer 605 such that the smart material layer 605 is substantially entirely covered by the electrode layer 604, and the smart material layer 605 overlays the grounding electrode layer 606 such that the grounding electrode layer 606 is substantially entirely covered by the smart material layer 605. As shown in FIG. 6A, the power element 603 includes a first contact 610A configured to make contact with and establish electrical communication with the electrode layer 604. A second contact 610B is configured to penetrate the electrode layer 604 and the smart material layer 605 so as to establish electrical communication with the grounding electrode layer 606. The second contact 610B is configured with insulation to prevent electrical communication with the smart material layer 605 and the electrode layer 604 through which the contact passes.

Figure 7:
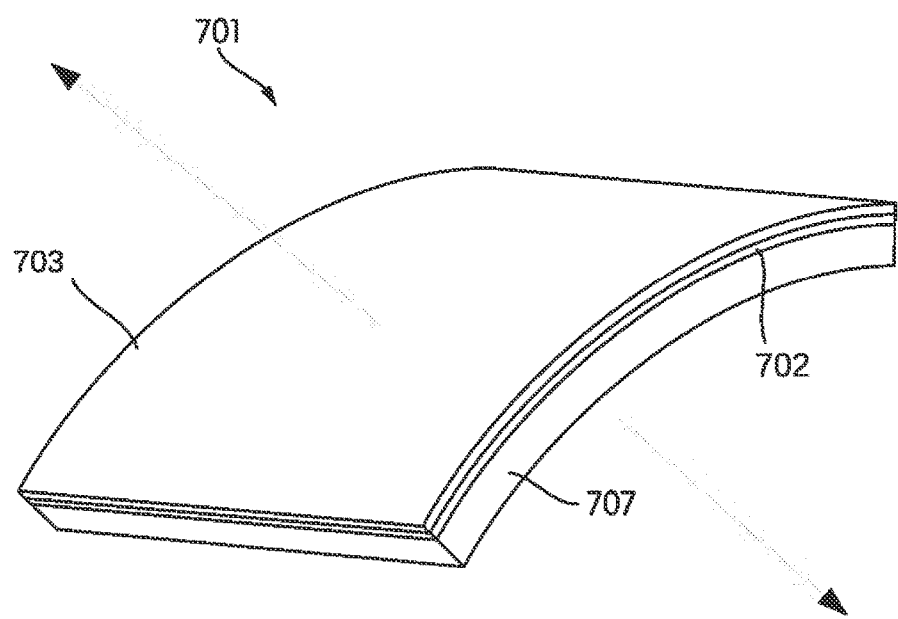
FIG. 7 illustrates motion of a wireless haptic enabled device in accordance with an embodiment hereof.

FIG. 7 illustrates motion of an actuated wireless haptic enabled device 701. As discussed above the wireless haptic enabled device 701 may be secured to a substrate 707, which may comprise a user's fingernail, a desktop surface, a user device, and/or any other substrate discussed herein. When subjected to a voltage differential, a smart material layer of actuator element 702 of the wireless haptic enabled device 701 is caused to actuate. Actuation of the smart material layer causes it, and thus the wireless haptic enabled device 701 to change in size and/or shape. This movement, in turn, causes the underlying substrate 707 to also deform in size and shape. In some implementations, a radiofrequency haptic control signal received by the power element 703 and transferred to the actuator element 702 causes the smart material layer to repeatedly actuate. In some implementations, repeated actuation may include a cycle of deformation and relaxation. In some implementations, repeated actuation may include a cycle of deformation and counter-deformation. The cyclical actuation caused by the radiofrequency haptic control signal causes the wireless haptic enabled device 701, and the substrate 707 to which it is secured, to vibrate, providing a haptic sensation to a user.

Figure 8:
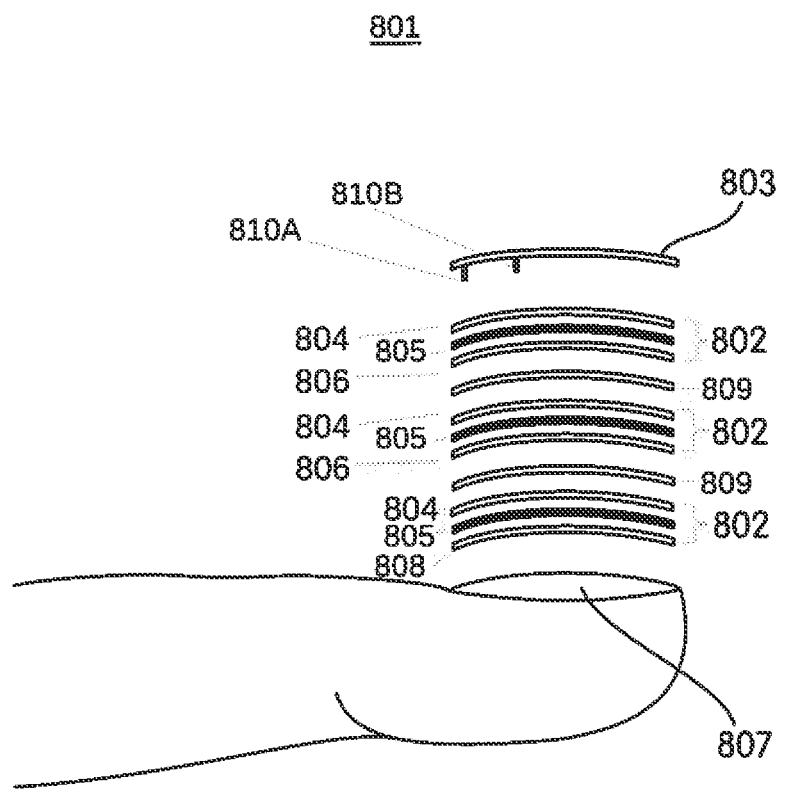
FIG. 8 illustrates a wireless haptic enabled device including multiple actuator elements in accordance with an embodiment hereof.

FIG. 8 illustrates a wireless haptic enabled device 801 including multiple or a plurality of actuator elements 802. Wireless haptic enabled device 801 includes multiple actuator elements 802, with each actuator element 802 including at least a smart material layer 805, an electrode layer 804, and a grounding electrode layer 806. The wireless haptic enabled device 801 may have a bottom-most grounding electrode layer 808 in contact with a substrate 807. Each additional actuator element 802 may include a smart material layer 805, an electrode layer 804, and a grounding electrode layer 806 layered atop the previous actuator element 802. An insulation layer 809 is included between each actuator element 802. Similar to other embodiments discussed herein, a power element 803 may be secured to overlay the structure. In embodiments hereof, the power element 803 may include contacts 810A and 810B configured to establish electrical communication with the electrode layers 804 and the grounding electrode layers 806, 808. In embodiments hereof, the power element 803 may include at least one insulated contact 810A configured to penetrate the stacked electrode and smart material layers to contact and establish electrical communication with the grounding electrode layers 806, 808 and at least one insulated contact 810B configured to penetrate the stacked electrode and smart material layers to contact and establish electrical communication with the electrode layers 804. Alternative contacts 810A and 810B may be employed to establish electrical communication with the electrode layers 804 and the grounding electrode layers 806, 808 so as to generate a voltage differential in each actuator element 802. The addition of multiple actuators may provide a stronger haptic response. The haptic response of smart materials is related to the size of the voltage differential used for actuation. Conventionally, a relatively high voltage (e.g., as high as 500V) is required to cause actuation of smart materials. Under some conditions, the wireless haptic control signal received by the antenna of the power element 803 may induce a voltage potential that causes the wireless haptic enabled device 801 to produce a weak haptic effect that is minimally perceptible or imperceptible to a user of the wireless haptic enabled device 801. The use of multiple actuators increases the strength of a haptic effect at a given voltage, creating enhanced user perception. As discussed above, wireless haptic enabled devices consistent with the invention may have an extremely low profile (e.g., less than 0.5 mm). Stacking multiple actuators provides a solution to increasing the strength, and therefore the perceptibility, of a haptic response without a requirement of increasing a voltage level or creating a structure that is prohibitively bulky.

Figure 9:
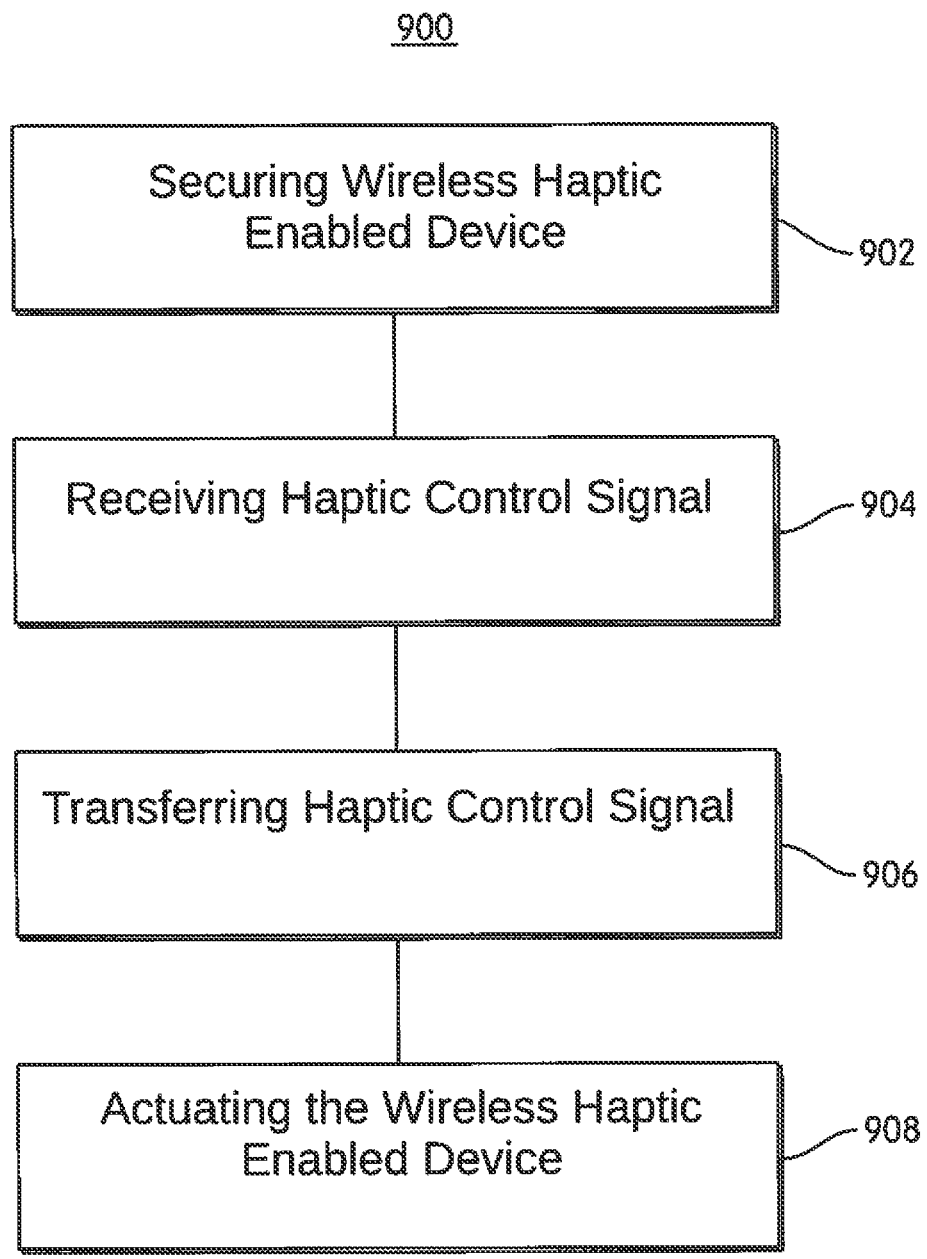
FIG. 9 is a flow chart illustrating a method for wirelessly providing haptic effects in accordance with an embodiment hereof.

FIG. 9 illustrates a method for wirelessly providing haptic effects. Wireless haptic effect process 900 may be implemented via the systems and devices discussed herein, including, for example, the wireless haptic enabled devices and the activation units.

In an operation 902, process 900 may include securing a wireless haptic enabled device to a substrate. The haptic enabled device that is secured may be a wireless haptic enabled device as discussed herein, and may include an actuator element having an electrode layer and a smart material layer and a power element including an antenna configured to receive a haptic control signal. The power element may further include a first contact and a second contact in electrical communication with the antenna.

In some embodiments, securing the haptic enabled device includes forming at least a portion of the haptic enabled device, e.g., an actuator layer, in situ. Forming the actuator layer in situ may include applying a conductive liquid to the substrate to cure as a grounding electrode layer serving as the grounding electrode layer, applying a liquid polymer to the grounding electrode layer to cure as the smart material layer overlaying at least a portion of the grounding electrode layer, and applying a conductive liquid to the smart material layer to cure as the electrode layer, overlaying at least a portion of the smart material layer.

In some embodiments, securing the haptic enabled device includes adhering the actuator element to the substrate. In some embodiments, securing the haptic enabled device includes adhering the power element to the actuator element. Some embodiments may include a combination of painted on layers and adhered layers. For example, the actuator element may be secured via painting on the electrode and smart material layers, while the power element may be secured via adhesion.

Securing the haptic enabled device may further include overlaying the smart material layer over only a portion of the grounding electrode layer to create an exposed portion of the grounding electrode layer. When the power element is secured to the actuator element, the second contact of the power element may be applied to contact the exposed portion of the grounding electrode layer.

In some embodiments, securing the haptic enabled device may further include overlaying the smart material layer on the grounding electrode layer to cover substantially all of the grounding electrode layer and overlaying the electrode layer on the smart material layer to cover substantially all of the smart material layer. In this embodiment, the power element may include a penetrating contact configured to penetrate the electrode layer and smart material layer to contact the grounding electrode layer underneath.

In additional embodiments, securing the haptic enabled device may further include securing multiple actuator elements atop one another. Securing additional actuator elements may include securing a smart material layer and an electrode layer atop the electrode layer of the previous (lower) actuator element.

In an operation 904, process 900 may include receiving, via an antenna, a haptic control signal. The antenna may receive a haptic control signal from an activation unit that includes an antenna. As discussed above, the activation unit may be incorporated as part of a more comprehensive computer system, may be a stand-alone device, may be part of a mobile device or tablet computer, and/or may take other forms.

Receiving the haptic control signal may include receiving a haptic control signal having a frequency substantially similar to a resonant frequency of the power element antenna and substantially similar to a mechanical resonant frequency of the haptic enabled device structure, including the haptic enabled device and the structure to which it is secured. When the frequency of the haptic control signal is substantially similar to the resonant frequency of the power element antenna, reception efficiency is improved. Substantial similarity or an exact match between the haptic control signal and the resonant frequency of the power element antenna thus increases the efficiency of power transfer. In turn, substantial similarity or an exact match between the haptic control signal and the resonant frequency of the haptic enabled device structure serves to amplify the strength of the haptic effect of the haptic enabled device. Thus, by achieving a substantially similar match between the frequencies of the power element antenna, the haptic actuation structure, and the haptic control signal, stronger results can be achieved at lower transmitted power levels.

In an operation 906, process 900 may include transferring the haptic control signal to the electrode layer and a grounding electrode layer via a first contact and a second contact to cause a voltage differential between the electrode layer and the grounding electrode layer. The first contact and second contact, as discussed above, communicate electrically with the electrode layer and the grounding electrode layer and cause the voltage differential in response to the haptic control signal.

In an operation 908, process 900 may include actuating the wireless haptic enabled device via the voltage differential. The voltage differential between the electrode layer and the grounding electrode layer acts across the smart material layer to actuate the smart material, causing bending in the smart material. In embodiments hereof, the haptic control signal is an alternating current signal, the voltage differential oscillates direction, thereby causing the smart material to bend back and forth, i.e., to vibrate, thus producing an effect felt by a user of the system.

Thus, there are provided wireless haptic enabled systems and devices, and methods of securing wireless haptic enabled systems and devices to various substrates. While various embodiments according to the present invention have been described above, it should be understood that they have been presented by way of illustration and example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment. Stated another way, aspects of the above methods of rendering haptic effects may be used in any combination with other methods described herein or the methods can be used separately. All patents and publications discussed herein are incorporated by reference herein in their entirety.

What is claimed is:

1. A haptic enabled device for providing a haptic effect, comprising:
   an actuator element including an electrode layer, a smart material layer, and a grounding electrode layer, wherein the grounding electrode layer is configured for contact with a substrate; and
   a power element configured to receive a haptic control signal, the power element comprising a first contact and a second contact,
   wherein
      the electrode layer is configured for location between the smart material layer and the power element,
      the first contact is configured for electrical communication with the electrode layer,
      the second contact is configured for electrical communication with the grounding electrode layer,
      the power element is configured to induce a voltage differential between the electrode layer and the grounding electrode layer in response to the haptic control signal, and
      the smart material layer is configured for actuation in response to the voltage differential for providing the haptic effect to the substrate,
   wherein at least one of the electrode layer, the smart material layer, and the grounding electrode layer is applied as a liquid.

2. The device of claim 1, wherein the smart material layer is applied to the grounding electrode layer as a liquid, and the electrode layer is applied to the smart material layer as a liquid after curing of the smart material layer.

3. The device of claim 1, wherein the smart material layer overlays only a portion of the grounding electrode layer leaving a first exposed portion of the grounding electrode layer and the electrode layer overlays only a portion of the smart material layer leaving a second exposed portion of the smart material layer.

4. The device of claim 3, wherein the second contact of the power element is configured to be in contact with the first exposed portion of the grounding electrode layer.

5. The device of claim 1, wherein the smart material layer overlays the grounding electrode layer to cover substantially all of the grounding electrode layer and the electrode layer overlays the smart material layer to cover substantially all of the smart material layer.

6. The device of claim 5, wherein the second contact of the power element is configured to penetrate the electrode layer and the smart material layer to contact the grounding electrode layer.

7. The device of claim 1, further including at least one additional actuator element overlaying the actuator element.

8. The device of claim 1, wherein the power element further includes an antenna in electrical communication with the first contact and the second contact, the antenna being configured to receive a wireless signal.

9. A method for providing a haptic effect, comprising:
   securing an actuator element to a substrate, the actuator element having an electrode layer, a smart material layer, and a grounding electrode layer;
   securing a power element to the actuator element to form a haptic device, wherein the power element includes a first contact and a second contact and is configured to receive a haptic control signal;
   receiving, at the power element, the haptic control signal;
   transferring the haptic control signal to the electrode layer and the grounding electrode layer via the first contact and the second contact to cause a voltage differential between the electrode layer and the grounding electrode layer; and
   actuating the smart material layer by the voltage differential to provide the haptic effect.

10. The method of claim 9, wherein securing the actuator element to the substrate includes forming the actuator element in situ by,
   applying a conductive liquid to the substrate to cure as the grounding electrode layer;
   applying a liquid polymer to the grounding electrode layer to cure as the smart material layer overlaying at least a portion of the grounding electrode layer; and
   applying a conductive liquid to the smart material layer to cure as the electrode layer overlaying at least a portion of the smart material layer.

11. The method of claim 9, wherein securing the power element to the actuator element to form the haptic device includes adhering the power element to the electrode layer of the actuator element.

12. The method of claim 9, wherein securing the actuator element to the substrate includes forming the actuator element by overlaying the smart material layer on the grounding electrode layer to leave an exposed portion of the grounding electrode layer and overlaying the electrode layer on the smart material layer to leave an exposed portion of the smart material layer.

13. The method of claim 12, wherein securing the power element to the actuator element to form the haptic device includes disposing the second contact of the power element to contact the exposed portion of the grounding electrode layer.

14. The method of claim 9, wherein securing the actuator element to the substrate includes forming the actuator element by overlaying the smart material layer on the grounding electrode layer to cover substantially all of the grounding electrode layer and overlaying the electrode layer on the smart material layer to cover substantially all of the smart material layer.

15. The method of claim 14, wherein securing the power element to the actuator element to form the haptic device includes penetrating the electrode layer and the smart material layer with the second contact to contact the grounding electrode layer.

16. The method of claim 9, wherein the power element further includes an antenna in electrical communication with the first contact and the second contact, the method further comprising
receiving a wireless signal at the antenna.

17. A haptic enabled device for providing a haptic effect, comprising:
an actuator element including an electrode layer, a smart material layer, and a grounding electrode layer, wherein the grounding electrode layer is configured for contact with a substrate; and
a power element configured to receive a haptic control signal, the power element comprising a first contact and a second contact, wherein
the electrode layer is configured for location between the smart material layer and the power element,
the first contact is configured for electrical communication with the electrode layer,
the second contact is configured for electrical communication with the grounding electrode layer,
the power element is configured to induce a voltage differential between the electrode layer and the grounding electrode layer in response to the haptic control signal, and
the smart material layer is configured for actuation in response to the voltage differential for providing the haptic effect to the substrate.

18. The device of claim 17, wherein the power element further includes an antenna in electrical communication with the first contact and the second contact, the antenna being configured to receive a wireless signal.

19. The device of claim 17, wherein the smart material layer overlays only a portion of the grounding electrode layer leaving a first exposed portion of the grounding electrode layer and the electrode layer overlays only a portion of the smart material layer leaving a second exposed portion of the smart material layer.

20. The device of claim 19, wherein the second contact of the power element is configured to be in contact with the first exposed portion of the grounding electrode layer.

* * * * *